United States Patent
Wakabayashi et al.

(10) Patent No.: US 9,462,678 B2
(45) Date of Patent: Oct. 4, 2016

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Yuki Wakabayashi, Nagaokakyo (JP); Shigeru Tago, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 63 days.

(21) Appl. No.: 14/661,171

(22) Filed: Mar. 18, 2015

(65) Prior Publication Data

US 2015/0195900 A1 Jul. 9, 2015

Related U.S. Application Data

(63) Continuation of application No. PCT/JP2014/066812, filed on Jun. 25, 2014.

(30) Foreign Application Priority Data

Aug. 2, 2013 (JP) ................................. 2013-161019

(51) Int. Cl.
*H01P 3/08* (2006.01)
*H05K 1/02* (2006.01)
(Continued)

(52) U.S. Cl.
CPC ............. *H05K 1/0242* (2013.01); *H01P 3/081* (2013.01); *H01P 3/085* (2013.01); *H01P 5/028* (2013.01);
(Continued)

(58) Field of Classification Search
CPC .......... H01P 3/08; H01P 3/081; H01P 3/082; H01P 3/085; H01P 3/088; H05K 1/024; H05K 2201/0715
USPC ................................................. 333/238, 246
See application file for complete search history.

(56) References Cited

U.S. PATENT DOCUMENTS

2009/0146762 A1 6/2009 Shiokawa et al.
2012/0138340 A1 6/2012 Kato et al.
(Continued)

FOREIGN PATENT DOCUMENTS

JP 2009-130699 A 6/2009
JP 2010-219262 A 9/2010
(Continued)

OTHER PUBLICATIONS

Official Communication issued in International Patent Application No. PCT/JP2014/066812, mailed on Sep. 30, 2014.

*Primary Examiner* — Stephen E Jones
(74) *Attorney, Agent, or Firm* — Keating & Bennett, LLP

(57) ABSTRACT

A high-frequency signal transmission line includes a first ground conductor located at one side in a stacking direction of a stacked body of dielectric layers in relation to a signal line; a second ground conductor located at another side in the stacking direction in relation to the signal line; and a connection portion including interlayer connection conductors and connection conductors to connect the first ground conductor to the second ground conductor. Two of the interlayer connection conductors constituting both ends in the stacking direction of the connection portion are located farther away from a center of a bending section of the body than the other interlayer connection conductors. Openings are provided respectively in ones of the dielectric layers located at the one side and the another side in the stacking direction in relation to the other interlayer connection conductors, at positions that overlap with the other interlayer connection conductors.

18 Claims, 13 Drawing Sheets

(51) Int. Cl.
*H01P 5/02* (2006.01)
*H04B 5/00* (2006.01)
*H05K 1/11* (2006.01)
*H05K 1/14* (2006.01)

(52) U.S. Cl.
CPC ............ *H04B 5/00* (2013.01); *H05K 1/025* (2013.01); *H05K 1/028* (2013.01); *H05K 1/0225* (2013.01); *H05K 1/0251* (2013.01); *H05K 1/118* (2013.01); *H05K 1/147* (2013.01); *H05K 2201/10189* (2013.01)

(56) References Cited

U.S. PATENT DOCUMENTS

2014/0176264 A1    6/2014   Tago et al.
2014/0176266 A1    6/2014   Kato et al.

FOREIGN PATENT DOCUMENTS

| | | |
|---|---|---|
| JP | 2012-227632 A | 11/2012 |
| WO | 2011/007660 A1 | 1/2011 |
| WO | 2011/018979 A1 | 2/2011 |
| WO | 2013/069763 A1 | 5/2013 |
| WO | 2013/094471 A1 | 6/2013 |

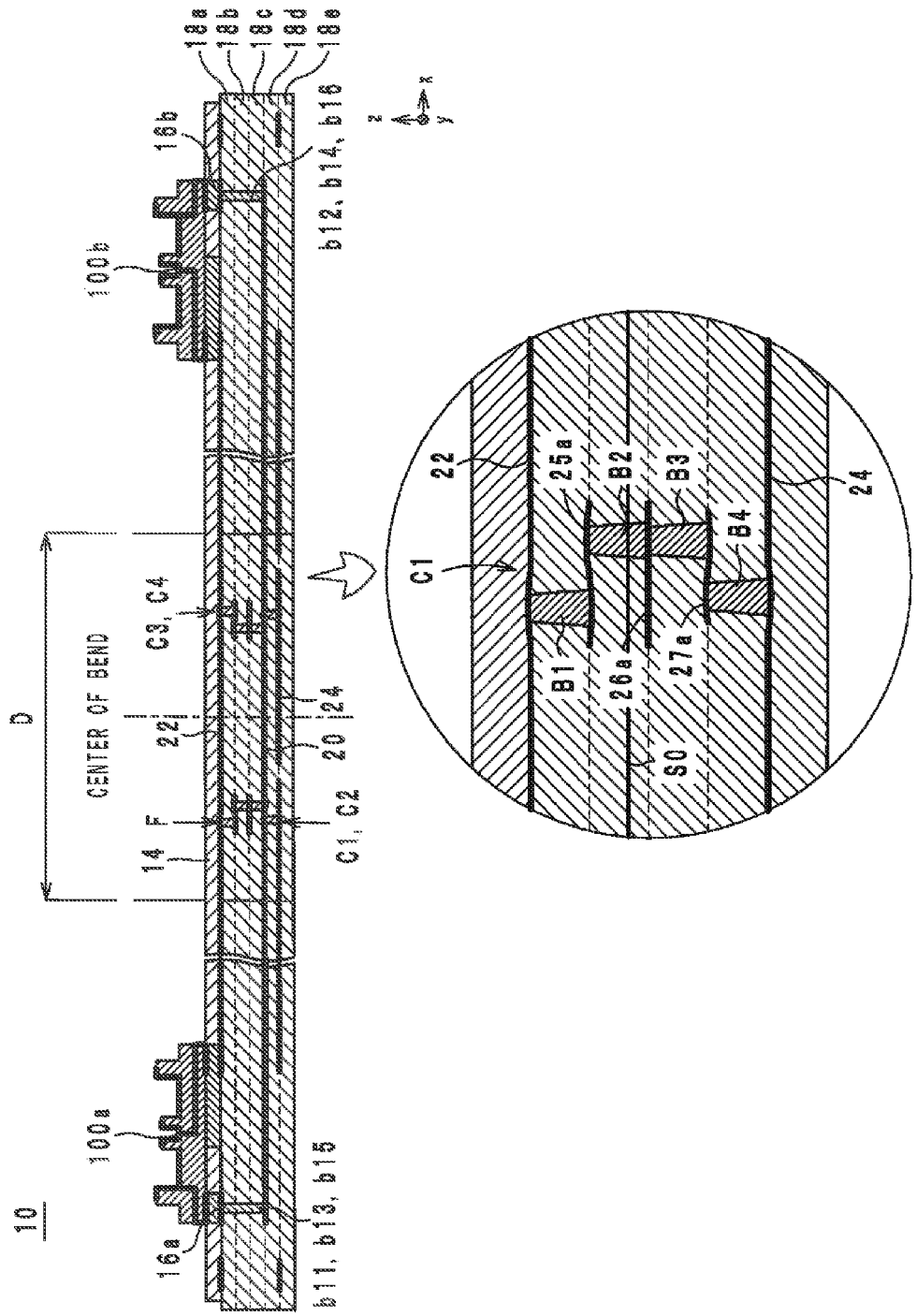

HIGH-FREQUENCY SIGNAL TRANSMISSION LINE AND ELECTRONIC DEVICE

BACKGROUND OF THE INVENTION

1. Field of the Invention

The present invention relates to a high-frequency signal transmission line and an electronic device, and more particularly to a high-frequency signal transmission line preferably for use in high-frequency signal transmission and an electronic device.

2. Description of the Related Art

As a conventional high-frequency signal transmission line, for example, a signal line disclosed in WO 2011/007660 is known. The signal line disclosed in WO 2011/007660 includes a stacked body, a signal line, a first ground conductor, a second ground conductor, and via-hole conductors. The stacked body is a stack of insulating layers. The signal line is a linear conductor provided in the stacked body. The first ground conductor and the second ground conductor are stacked together with the insulating layers so as to face each other across the signal line. Accordingly, the signal line and the first and the second ground conductors form a stripline structure. The via-hole conductors are pierced in the insulating layers so as to connect the first ground conductor to the second ground conductor.

The signal line disclosed in WO 2011/007660 has a problem that the stacked body is hard to bend. Specifically, in the signal line disclosed in WO 2011/007660, a plurality of via-hole conductors are connected so as to be arranged straight in a stacking direction and configure a cylinder. The via-hole conductors connected straight to configure a cylinder are not flexible, and these via-hole conductors hinder bending of the stacked body.

SUMMARY OF THE INVENTION

Preferred embodiments of the present invention provide a high-frequency signal transmission line that is easy to bend, and an electronic device.

A high-frequency signal transmission line according to a first aspect of various preferred embodiments of the present invention is a high-frequency signal transmission line that is bent when used. The high-frequency signal transmission line includes a body including dielectric layers stacked on top of one another; a signal line provided in the body; a first ground conductor located at one side in a stacking direction in relation to the signal line so as to face the signal line across one or more of the dielectric layers; a second ground conductor located at another side in the stacking direction in relation to the signal line so as to face the signal line across one or more of the dielectric layers; and a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor, wherein two of the interlayer connection conductors that constitute both ends in the stacking direction of the connection portion are located farther away from a center of a bending section where the body is to be bent than the other interlayer connection conductors of the connection portion; and openings are located respectively in ones of the dielectric layers located at the one side and the another side in the stacking direction in relation to the other interlayer connection conductors, at positions that overlap with the other interlayer connection conductors.

A high-frequency signal transmission line according to a second aspect of various preferred embodiments of the present invention is a high-frequency signal transmission line that is bent when used. The high-frequency signal transmission line includes a body including dielectric layers stacked on top of one another; a signal line provided in the body; a first ground conductor located at a side in a stacking direction in relation to the signal line so as to face the signal line across one or more of the dielectric layers; a second ground conductor located at another side in the stacking direction in relation to the signal line so as to face the signal line across one or more of the dielectric layers; and a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor, wherein two of the interlayer connection conductors that constitute both ends in the stacking direction of the connection portion are located farther away from a center of a bending section where the body is to be bent than another of the interlayer connection conductors of the connection portion crossing a neutral surface of the bending section.

An electronic device according to the second aspect of various preferred embodiments of the present invention includes an article, and a high-frequency signal transmission line that is bent when used. The high-frequency signal transmission line includes a body including dielectric layers stacked on top of one another; a signal line provided in the body; a first ground conductor located at one side in a stacking direction in relation to the signal line so as to face the signal line across one or more of the dielectric layers; a second ground conductor located at another side in the stacking direction in relation to the signal line so as to face the signal line across one or more of the dielectric layers; and a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor, wherein two of the interlayer connection conductors that constitute both ends in the stacking direction of the connection portion are located farther away from a center of a bending section where the body is to be bent than another of the interlayer connection conductors of the connection portion crossing a neutral surface of the bending section; and a main surface of the body nearer the first ground conductor in relation to the signal line contacts with the article.

According to various preferred embodiments of the present invention, a dielectric body that is easy to bend is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a sectional view of the high-frequency signal transmission line according to a preferred embodiment of the present invention.

DETAILED DESCRIPTION OF THE PREFERRED EMBODIMENTS

High-frequency signal transmission lines and electronic devices according to preferred embodiments of the present invention will be described with reference to the drawings.

Figure 1A:
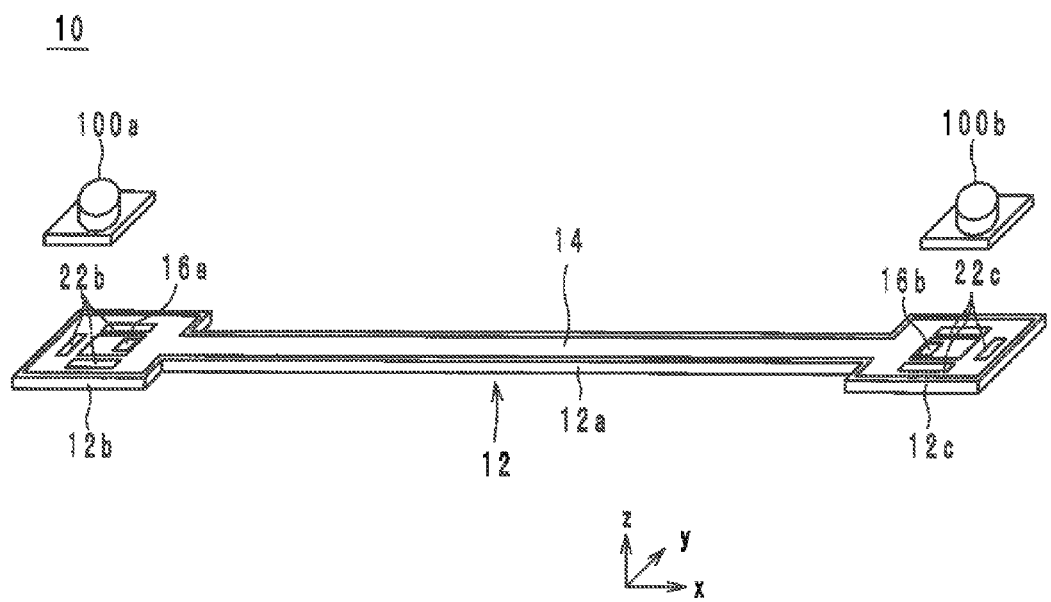
FIG. 1A is a perspective view of a high-frequency signal transmission line according to a preferred embodiment of the present invention.
Figure 1B:
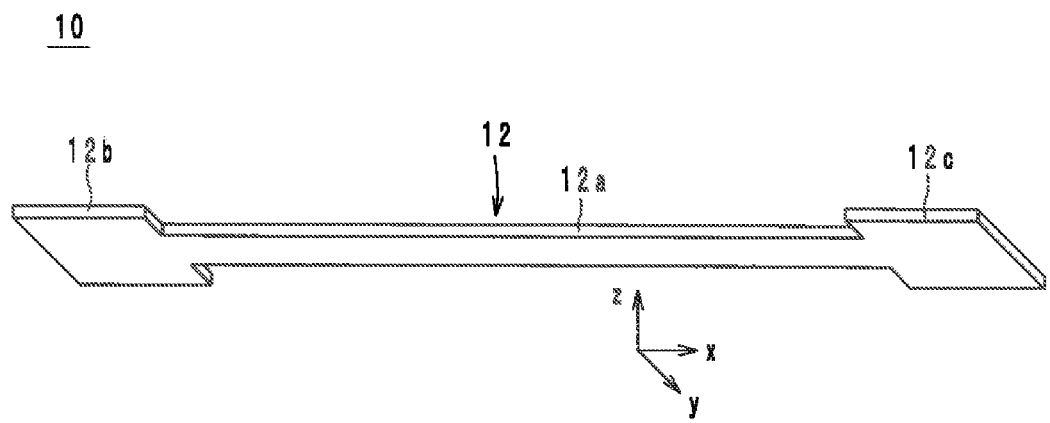
FIG. 1B is a perspective view of the high-frequency signal transmission line according to a preferred embodiment of the present invention.
Figure 2:
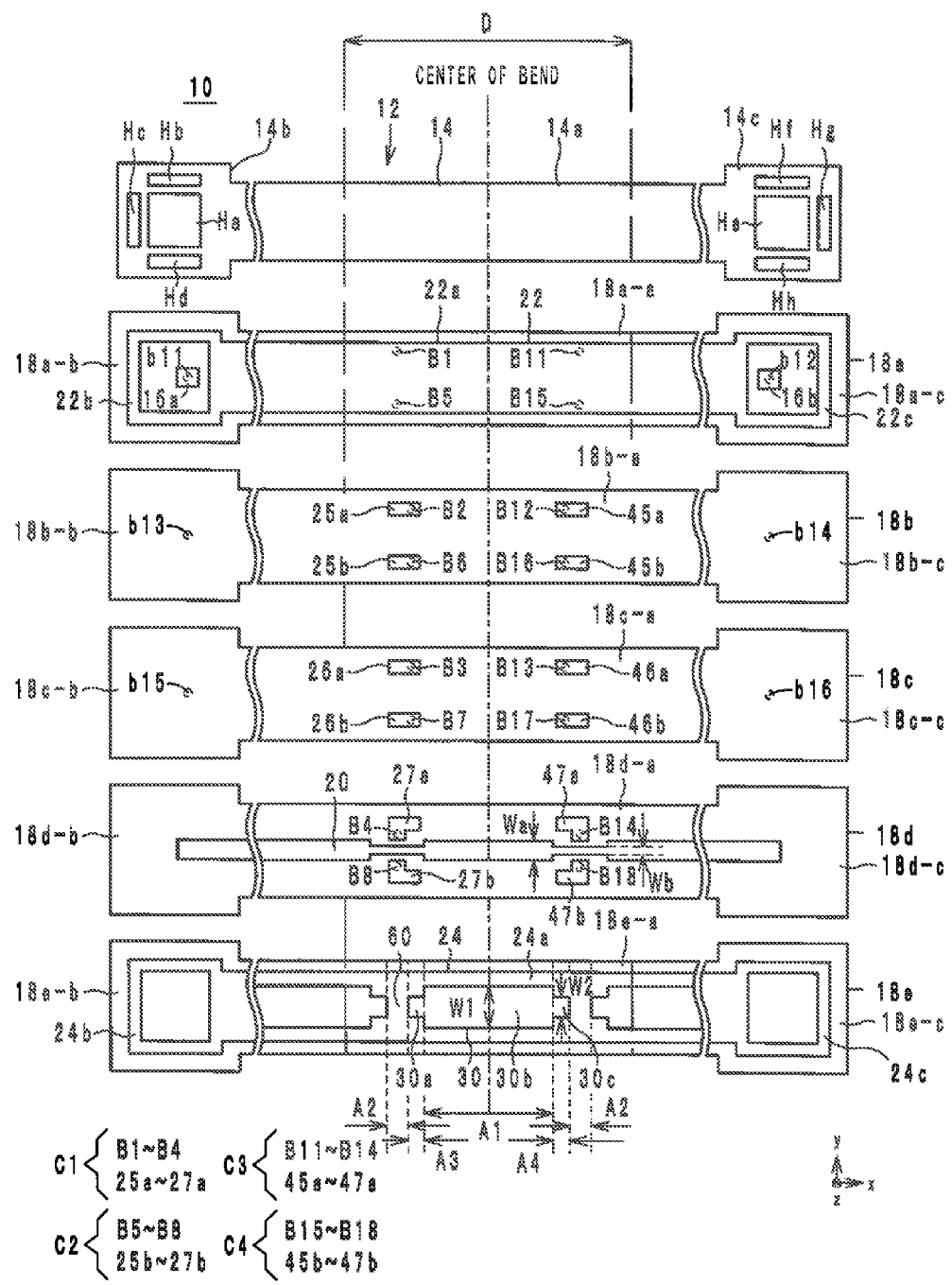
FIG. 2 is an exploded view of a dielectric body of the high-frequency signal transmission line according to a preferred embodiment of the present invention.

The structure of a high-frequency signal transmission line according to a preferred embodiment of the present invention is described with reference to the drawings. FIGS. 1A and 1B are perspective views of a high-frequency signal transmission line 10 according to a preferred embodiment of the present invention. FIG. 2 is an exploded view of a dielectric body 12 of the high-frequency signal transmission line 10. FIG. 3A is a sectional view of the high-frequency signal transmission line 10. In the sectional view of FIG. 3A, via-hole conductors B1 through B4 and B11 through B14 are at the same positions as via-hole conductors B5 through B8 and B15 through B18, respectively, and connection conductors 25a, 26a, 27a, 45a, 46a and 47a are at the same positions as connection conductors 25b, 26b, 27b, 45b, 46b and 47b, respectively. In FIGS. 1 through 3A, the stacking direction of the high-frequency signal transmission line 10 is defined as z-direction. The lengthwise direction of the high-frequency signal transmission line 10 is defined as x-direction. The direction orthogonal to the x-direction and the z-direction is defined as y-direction.

The high-frequency signal transmission line 10 is flexible, and the high-frequency signal transmission line 10 is bent when it is used. As illustrated in FIGS. 1A through 3, the high-frequency signal transmission line 10 includes a dielectric body 12, external terminals 16a and 16b, a signal line 20, ground conductors 22 and 24, connection portions C1 through C4 (see FIG. 3A), and connectors 100a and 100b.

When viewed from the z-direction, the dielectric body 12 extends in the x-direction, and includes a line portion 12a, and connecting portions 12b and 12c. The dielectric body 12 is, as illustrated in FIG. 2, a flexible stacked body of a protective layer 14 and dielectric sheets (insulating layers) 18a through 18e stacked in this order from a positive side to a negative side in the z-direction. In the following, a main surface of the dielectric body 12 at the positive side in the z-direction is referred as a front surface, and a main surface of the dielectric body 12 at the negative side in the z-direction is referred as a back surface.

The line portion 12a extends in the x-direction. The connecting portions 12b and 12c preferably are rectangular or substantially rectangular portions connected to a positive end in the x-direction and a negative end in the x-direction, respectively, of the line portion 12a. The widths (sizes in the y-direction) of the connecting portions 12b and 12c are greater than the width (size in the y-direction) of the line portion 12a.

The dielectric sheets 18a through 18e, as seen in FIG. 2, extend in the x-direction and have the same shape as the dielectric body 12 when viewed from the z-direction. The dielectric sheets 18a through 18e are formed of flexible thermoplastic resin such as polyimide, liquid polymer or the like. The thickness of each of the dielectric sheets 18a through 18e after pressure bonding preferably is, for example, within a range of about 10 μm to about 150 μm. In the following, a main surface of each of the dielectric sheets 18a through 18e at the positive side in the z-direction is hereinafter referred to as a front surface, and a main surface of each of the dielectric sheets 18a through 18e at the negative side in the z-direction is hereinafter referred to as a back surface.

The dielectric sheet 18a includes a line portion 18a-a, and connecting portions 18a-b and 18a-c. The dielectric sheet 18b includes a line portion 18b-a, and connecting portions 18b-b and 18b-c. The dielectric sheet 18c includes a line portion 18c-a, and connecting portions 18c-b and 18c-c. The dielectric sheet 18d includes a line portion 18d-a, and connecting portions 18d-b and 18d-c. The dielectric sheet 18e includes a line portion 18e-a, and connecting portions 18e-b and 18e-c. The line portions 18a-a, 18b-a, 18c-a, 18d-a and 18e-a constitute the line portion 12a of the dielectric body 12. The connecting portions 18a-b, 18b-b, 18c-b, 18d-b and 18e-b constitute the connecting portion 12b of the dielectric body 12. The connecting portions 18a-c, 18b-c, 18c-c, 18d-c and 18e-c constitute the connecting portion 12c of the dielectric body 12.

As seen in FIGS. 1A and 2, the external terminal 16a is a rectangular or substantially rectangular conductor provided substantially in the center of the front surface of the connecting portion 18a-b. As seen in FIGS. 1A and 2, the external terminal 16b is a rectangular or substantially rectangular conductor provided substantially in the center of the front surface of the connecting portion 18a-c. The external terminals 16a and 16b are formed of a metal material with a low specific resistance containing mainly of silver or copper. The external terminals 16a and 16b are plated with gold.

As seen in FIG. 2, the signal line 20 is a linear conductor embedded in the dielectric body 12. Specifically, the signal line 20 is provided on the front surface of the dielectric sheet 18d so as to extend in the x-direction. Both ends of the signal line 20 are located to overlap with the external terminals 16a and 16b, respectively, when viewed from the z-direction. The signal line 20 is formed of a metal material with a low specific resistance containing mainly of silver or copper.

Via-hole conductors b11, b13 and b15 are pierced in the connecting portions 18a-b, 18b-b, 18c-b of the dielectric sheets 18a, 18b and 18c, respectively, in the z-direction. The via-hole conductors b11, b13 and b15 are connected so as to define one via-hole conductor. Accordingly, the via-hole conductors b11, b13 and b15 connect the external terminal 16a to the negative end in the x-direction of the signal line 20.

Via-hole conductors b12, b14 and b16 are pierced in the connecting portions 18a-c, 18b-c, 18c-c of the dielectric sheets 18a, 18b and 18c, respectively, in the z-direction. The via-hole conductors b12, b14 and b16 are connected so as to define one via-hole conductor. Accordingly, the via-hole conductors b12, b14 and b16 connect the external terminal 16b to the negative end in the x-direction of the signal line 20. The via-hole conductors b11 through b16 are formed of a metal material with a low specific resistance containing mainly of silver or copper.

As seen in FIGS. 2 and 3A, the ground conductor 22 (first ground conductor) is provided in the dielectric body 12 and located farther in the positive z-direction than the signal line 20. Specifically, the ground conductor 22 is provided on the front surface of the dielectric sheet 18a. The ground conductor 22 extends in the x-direction on the front surface of the dielectric sheet 18a so as to face the signal line 20 across the dielectric sheets 18a through 18c.

The ground conductor 22 includes a line portion 22a, and terminal portions 22b and 22c. The line portion 22a is provided on the front surface of the line portion 18a-a and extends in the x-direction. The line portion 22a has no substantial openings, and the line portion 22a is a continuous electrode provided in the line portion 12a to extend in the x-direction continuously along the signal line 20. The line portion 22a of the ground conductor 22 does not necessarily cover the entire front surface of the line portion 12a. For example, micro holes may be provided in the line portion 22a, at predetermined positions, for escape of gas generated by thermocompression bonding of the dielectric sheets 18 formed of thermoplastic resin. The line portion 22a is formed of a metal material with a low specific resistance containing mainly of silver or copper.

The terminal portion 22b is provided on the front surface of the connecting portion 18a-b, and is shaped like a rectangular or substantially rectangular ring enclosing the external terminal 16a. The terminal portion 22b is connected to the negative end in the x-direction of the line portion 22a. The terminal portion 22c is provided on the front surface of the connecting portion 18a-c, and is shaped like a rectangular or substantially rectangular ring enclosing the external terminal 16b. The terminal portion 22c is connected to the positive end in the x-direction of the line portion 22a.

As seen in FIGS. 2 and 3A, the ground conductor 24 (second ground conductor) extends in the x-direction along the signal line 20. Specifically, the ground conductor 24 is provided in the dielectric body 12 and located farther in the negative z-direction than the signal line 20. More specifically, the ground conductor 24 is provided on the front surface of the dielectric sheet 18e. The ground conductor 24 extends in the x-direction on the front surface of the dielectric sheet 18e so as to face the signal line 20 across the dielectric sheet 18d. The ground conductor 24 is formed of a metal material with a low specific resistance containing mainly of silver or copper.

The ground conductor 24 includes a line portion 24a, and terminal portions 24b and 24c. The line portion 24a is provided on the front surface of the line portion 18a-e and extends in the x-direction. The line portion 24a includes openings 30, which are non-conductive portions, and bridges 60, which are conductive portions, arranged alternately at uniform or substantially uniform intervals along the signal line 20. Accordingly, the line portion 24a is shaped like a ladder. As seen in FIG. 2, the openings 30 overlap with the signal line 20 when viewed from the z-direction. Thus, when viewed from the z-direction, the signal line 20 is overlapped with the openings 30 and the bridges 60 alternately.

Now, the shape of each of the openings 30 is described. Each of the openings 30 includes opening portions 30a through 30c. The opening portion 30b is a rectangular or substantially rectangular opening portion extending in the x-direction. The opening portion 30a is a rectangular or substantially rectangular opening portion connected to the negative end in the x-direction of the opening portion 30b. The opening portion 30c is a rectangular or substantially rectangular opening portion connected to the positive end in the x-direction of the opening portion 30b. The width (size in the y-direction) W1 of the opening portion 30b is greater than the widths (sizes in the y-direction) W2 of the opening portions 30a and 30c. Accordingly, each of the openings 30 is shaped like a cross. When viewed from the z-direction, the signal line 20 crosses the centers of the openings 30 in the y-direction.

In the high-frequency signal transmission line 10, areas in which the opening portions 30b are located are referred to as areas A1, and areas in which the bridges 60 are located are referred to as areas A2. Areas in which the opening portions 30a are located are referred to as areas A3, and areas in which the opening portions 30c are located are referred to as areas A4.

The terminal portion 24b is provided on the front surface of the connecting portion 18e-b, and is shaped like a rectangular or substantially rectangular ring enclosing the center of the connecting portion 18e-b. The terminal portion 24b is connected to the negative end in the x-direction of the line portion 24a.

The terminal portion 24c is provided on the front surface of the connecting portion 18e-c, and is shaped like a rectangular or substantially rectangular ring enclosing the center of the connecting portion 18e-c. The terminal portion 24c is connected to the positive end in the x-direction of the line portion 24a.

As indicated in FIG. 2, the line width Wa of the signal line 20 in the areas A1 is greater than the line width Wb of the signal line 20 in the areas A2, A3 and A4. In the areas A1, the distance between the signal line 20 and the ground conductor 24 is greater, and therefore, in order to reduce the resistance of the signal line 20 to a high-frequency wave (conductor loss), the line width of the signal line 20 is increased to Wa. In the areas A2, A3 and A4, on the other hand, the distance between the signal line 20 and the ground conductor 24 is smaller, and therefore, in order to prevent a reduction in the impedance of the signal line 20, the line width of the signal line 20 is decreased to Wb.

Next, the connection portions C1 through C4 are described. As mentioned, the high-frequency signal transmission line 10 is bent when used. In the following paragraphs, a section where the dielectric body 12 of the high-frequency signal transmission line 10 to be bent is referred to as a section D. The dielectric body 12 is to be bent such that the section D protrudes in the negative z-direction. The center in the x-direction of the section D is referred to as a center of bend.

The connection portion C1 connects the line portion 22a of the ground conductor 22 to the line portion 24a of the ground conductor 24. The connection portion C1 includes via-hole conductors (interlayer connection conductors) B1 through B4 and connection conductors 25a through 27a connected to each other. As seen in FIG. 2, the connection portion C1 is located in the section D and farther in the negative x-direction than the center of bend. Also, the connection portion C1 is located farther in the positive y-direction than the signal line 20.

The via-hole conductor B1 is pierced in the line portion 18a-a of the dielectric sheet 18a in the z-direction, at a position farther in the positive y-direction than the signal line 20. The via-hole conductor B2 is pierced in the line portion 18b-a of the dielectric sheet 18b in the z-direction, at a position farther in the positive y-direction than the signal line 20. The central axis of the via-hole conductor B2 is located farther in the positive x-direction than the central axis of the via-hole conductor B1. The via-hole conductor B3 is pierced in the line portion 18c-a of the dielectric sheet 18c in the z-direction, at a position farther in the positive y-direction than the signal line 20. The central axis of the via-hole conductor B3 is located at the same position as the central axis of the via-hole conductor B2 and accordingly located farther in the positive x-direction than the central axis of the via-hole conductor B1. The via-hole conductor B4 is pierced in the line portion 18d-a of the dielectric sheet 18d in the z-direction, at a position farther in the positive y-direction than the signal line 20. The central axis of the via-hole conductor B4 is located farther in the negative x-direction than the central axes of the via-hole conductors B2 and B3. The via-hole conductors B1 through B4 are formed of a metal material with a low specific resistance containing mainly of silver or copper.

The connection conductor 25a is provided on the line portion 18b-a of the dielectric sheet 18b, at a position farther in the positive y-direction than the signal line 20. The connection conductor 25a is in the shape of a rectangle extending in the x-direction and connects the via-hole conductor B1 to the via-hole conductor B2. The negative end in the z-direction of the via-hole conductor B1 contacts with the negative end portion in the x-direction of the connection conductor 25a. The positive end in the z-direction of the via-hole conductor B2 contacts with the positive end portion in the x-direction of the connection conductor 25a.

The connection conductor 26a is provided on the line portion 18c-a of the dielectric sheet 18c, at a position farther in the positive y-direction than the signal line 20. The connection conductor 26a is in the shape of a rectangle extending in the x-direction and connects the via-hole conductor B2 to the via-hole conductor B3. The negative end in the z-direction of the via-hole conductor B2 contacts with the positive end portion in the x-direction of the connection conductor 26a. The positive end in the z-direction of the via-hole conductor B3 contacts with the positive end portion in the x-direction of the connection conductor 26a.

The connection conductor 27a is provided on the line portion 18d-a of the dielectric sheet 18d, at a position farther in the positive y-direction than the signal line 20. The connection conductor 27a is L-shaped and connects the via-hole conductor B3 to the via-hole conductor B4. The negative end in the z-direction of the via-hole conductor B3 contacts with the positive end portion in the x-direction of the connection conductor 27a. The positive end in the z-direction of the via-hole conductor B4 contacts with the negative end portion in the x-direction of the connection conductor 27a.

In the connection portion C1, as seen in FIG. 3A, the via-hole conductors B1 and B4 that constitute both ends in the z-direction of the connection portion C1 are located farther away from the center of bend than the other via-hole conductors B2 and B3 of the connection portion C1. The ground conductor 22 is located near the front surface of the dielectric body 12, and the ground conductor 24 is located near the back surface of the dielectric body 12. Therefore, a neutral surface S0 is located between the ground conductors 22 and 24. The neutral surface S0 is a surface on which no compression stress and no tensile stress act when the dielectric body 12 is bent at the section D. The via-hole conductors B1 through B4 have the same or substantially the same length, and the neutral surface S0 crosses the via-hole conductor B2 as illustrated in FIG. 3A. In this preferred embodiment, the via-hole conductors B1 and B4 that constitute the both ends in the z-direction of the connection portion C1 are located farther away from the center of bend than the via-hole conductor B2 crossing the neutral surface S0.

Figure 3B:
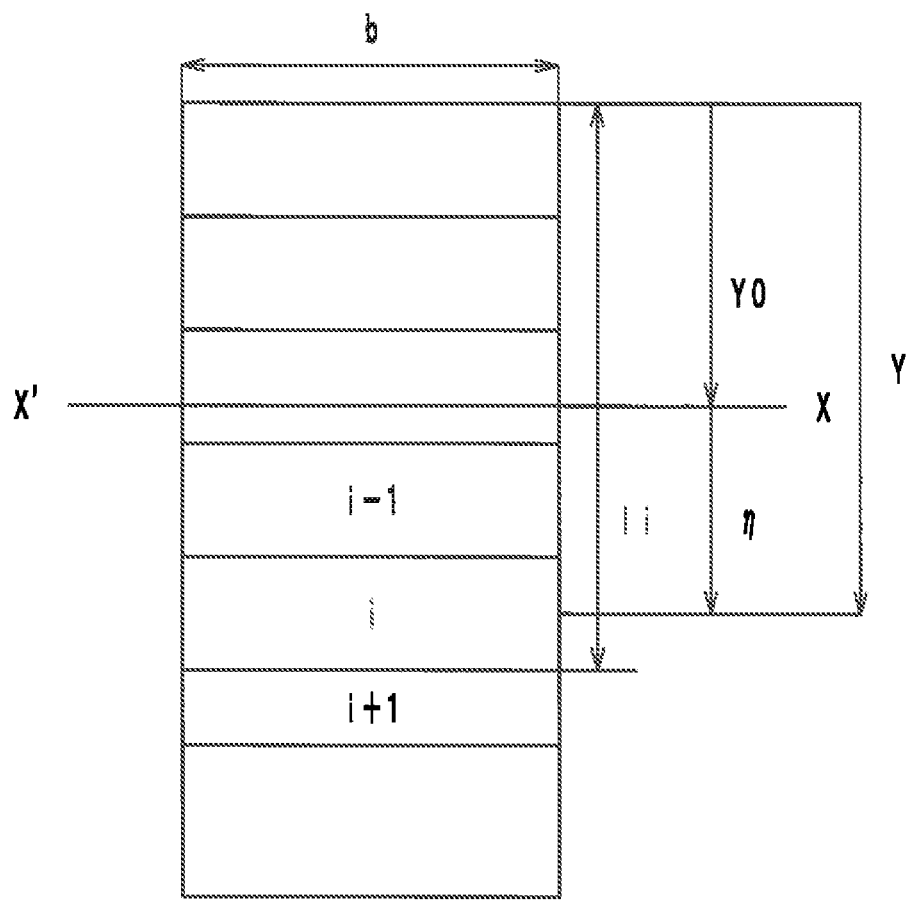
FIG. 3B is a sectional view of a stacked body used for derivation of a neutral surface.

For reference, derivation of the position of the neutral surface of a stacked body of insulating layers made of some kinds of materials, such as the dielectric body 12, is described with reference to the drawings. FIG. 3B is a sectional view of a stacked body 300 that was used for derivation of the neutral surface. In FIG. 3B, the stacking direction is defined as y-direction. The positive y-direction is a downward direction along the stacking direction as indicated in FIG. 3B.

The stacked body 300 includes n insulating layers stacked on top of one another. If the Young's modulus of the ith layer is denoted by Ei and the y-coordinate of the border between the ith insulating layer and the (i+1)th insulating layer is denoted by li, the y-coordinate Y0 of the neutral surface is expressed as follows.

$$Y0 = \frac{\sum_{i=1}^{n} Ei \int_{li-1}^{li} y\, dA}{\sum_{i=1}^{n} Ei \int_{li-1}^{li} dA} = \frac{\left\{\sum_{i=1}^{n} Ei(l_i^2 - l_{i-1}^2)\right\}}{2\sum_{i=1}^{n} Ei(l_i - l_{i-1})} \quad (1)$$

By using the expression (1), the position of the neutral surface S0 of the dielectric body 12 is derived.

The connection portion C2 connects the line portion 22a of the ground conductor 22 to the line portion 24a of the ground conductor 24. The connection portion C2 includes via-hole conductors B5 through B8 and connection conductors 25b through 27b connected to each other. As indicated in FIG. 2, the connection portion C2 is line-symmetrical or substantially line-symmetrical to the connection portion C1 with respect to the signal line 20, and a detailed description of the connection portion C2 is omitted.

The connection portion C3 connects the line portion 22a of the ground conductor 22 to the line portion 24a of the ground conductor 24. The connection portion C3 includes via-hole conductors (interlayer connection conductors) B11 through B14 and connection conductors 45a through 47a connected to each other. As seen in FIG. 2, the connection portion C3 is located in the bending section D and farther in the positive x-direction than the center of bend. The connection portion C3 is located farther in the positive y-direction than the signal line 20.

The via-hole conductor B11 is pierced in the line portion 18a-a of the dielectric sheet 18a in the z-direction, at a position farther in the positive y-direction than the signal line 20. The via-hole conductor B12 is pierced in the line portions 18b-a of the dielectric sheet 18b in the z-direction, at a position farther in the positive y-direction than the signal line 20. The central axis of the via-hole conductor B12 is located farther in the negative x-direction than the central axis of the via-hole conductor B11. The via-hole conductor B13 is pierced in the line portion 18c-a of the dielectric sheet 18c in the z-direction, at a position farther in the positive y-direction than the signal line 20. The central axis of the via-hole conductor B13 is located at the same position as the central axis of the via-hole conductor B12 and accordingly located farther in the negative x-direction than the central axis of the via-hole conductor B11. The via-hole conductor B14 is pierced in the line portion 18d-a of the dielectric sheet 18d in the z-direction, at a position farther in the positive y-direction than the signal line 20. The central axis of the via-hole conductor B14 is located farther in the positive x-direction than the central axes of the via-hole conductors B12 and B13. The via-hole conductors B11 through B14 are formed of a metal material with a low specific resistance containing mainly of silver or copper.

The connection conductor 45a is provided on the line portion 18b-a of the dielectric sheet 18b, at a position farther in the positive y-direction than the signal line 20. The connection conductor 45a is in the shape of a rectangle extending in the x-direction and connects the via-hole conductor B11 to the via-hole conductor B12. The negative end in the z-direction of the via-hole conductor B11 contacts with the positive end portion in the x-direction of the connection conductor 45a. The positive end in the z-direction of the via-hole conductor B2 contacts with the negative end portion in the x-direction of the connection conductor 45a.

The connection conductor 46a is provided on the line portion 18c-a of the dielectric sheet 18c, at a position farther in the positive y-direction than the signal line 20. The connection conductor 46a is in the shape of a rectangle extending in the x-direction and connects the via-hole conductor B12 to the via-hole conductor B13. The negative end in the z-direction of the via-hole conductor B12 contacts with the negative end portion in the x-direction of the connection conductor 46a. The positive end in the z-direction of the via-hole conductor B13 contacts with the negative end portion in the x-direction of the connection conductor 46a.

The connection conductor 47a is provided on the line portion 18d-a of the dielectric sheet 18d, at a position farther in the positive y-direction than the signal line 20. The connection conductor 47a is L-shaped and connects the via-hole conductor B13 to the via-hole conductor B14. The negative end in the z-direction of the via-hole conductor B13 contacts with the negative end portion in the x-direction of the connection conductor 47a. The positive end in the z-direction of the via-hole conductor B14 contacts with the positive end portion in the x-direction of the connection conductor 47a.

In the connection portion C3, as seen in FIG. 3A, the via-hole conductors B11 and B14 that constitute both ends in the z-direction of the connection portion C3 are located farther away from the center of bend than the other via-hole conductors B12 and B13. In this preferred embodiment, the via-hole conductors B11 and B14 that constitute the both ends in the z-direction of the connection portion C3 are located farther away from the center of bend than the via-hole conductor B12 crossing the neutral surface S0.

The connection portion C4 connects the line portion 22a of the ground conductor 22 to the line portion 24a of the ground conductor 24. The connection portion C4 includes via-hole conductors B15 through B18 and connection conductors 45b through 47b connected to each other. As indicated in FIG. 2, the connection portion C4 is line-symmetrical or substantially line-symmetrical to the connection portion C3 with respect to the signal line 20, and a detailed description of the connection portion C4 is omitted.

The connection portions C1 through C4 contact with the ground conductor 24 in the areas A2 between the openings 30. More specifically, the negative ends in the z-direction of the via-hole conductors B4, B8, B14 and B18 contact with the bridges 60.

As thus far described, the signal line 20 and the ground conductors 22 and 24 define a triplate-type stripline structure. The distance between the signal line 20 and the ground conductor 22 is equal or substantially equal to the total of the thicknesses of the dielectric sheets 18a through 18c and is, for example, within a range of about 50 µm to about 300 µm. In this preferred embodiment, the distance between the signal line 20 and the ground conductor 22 preferably is about 150 µm. The distance between the signal line 20 and the ground conductor 24 is equal or substantially equal to the thickness of the dielectric sheet 18d, and for example, within a range of about 10 µm to about 150 µm. In this preferred embodiment, the distance between the signal line 20 and the ground conductor 24 preferably is about 50 µm. Thus, the dielectric sheets 18a through 18d are designed such that the total of the thicknesses of the dielectric sheets 18a through 18c is greater than the thickness of the dielectric sheet 18d. The widths (sizes in the y-direction) of the ground conductors 22 and 24 preferably are, for example, about 800 µm. Thus, the high-frequency signal transmission line 10 is a thin and wide high-frequency signal transmission line.

The protective layer 14 covers substantially the entire front surface of the dielectric sheet 18a. Accordingly, the protective layer 14 covers the ground conductor 22. The protective layer 14 is formed of flexible resin, such as a resist material, for example.

As seen in FIG. 2, the protective layer 14 includes a line portion 14a, and connecting portions 14b and 14c. The line portion 14a covers the entire front surface of the line portion 18a-a of the dielectric sheet 18a and accordingly covers the line portion 22a of the ground conductor 22.

The connecting portion 14b is connected to the negative end in the x-direction of the line portion 14a and covers the front surface of the connecting portion 18a-b. However, the connecting portion 14b includes openings Ha through Hd. The opening Ha is a rectangular or substantially rectangular opening located substantially in the center of the connecting portion 14b. The external terminal 16a is exposed to outside through the opening Ha. The opening Hb is a rectangular or substantially rectangular opening located farther in the positive y-direction than the opening Ha. The opening Hc is a rectangular or substantially rectangular opening located farther in the negative x-direction than the opening Ha. The opening Hd is a rectangular or substantially rectangular opening located farther in the negative y-direction than the opening Ha. The terminal portion 22b is exposed to outside through the openings Hb through Hd and defines and functions as an external terminal.

The connecting portion 14c is connected to the positive end in the x-direction of the line portion 14a and covers the front surface of the connecting portion 18a-c. However, the connecting portion 14c includes openings He through Hh. The opening He is a rectangular or substantially rectangular opening located substantially in the center of the connecting portion 14c. The external terminal 16b is exposed to outside through the opening He. The opening Hf is a rectangular or substantially rectangular opening located farther in the positive y-direction than the opening He. The opening Hg is a rectangular or substantially rectangular opening located farther in the positive x-direction than the opening He. The opening Hh is a rectangular or substantially rectangular opening located farther in the negative y-direction than the opening He. The terminal portion 22c is exposed to outside through the openings Hf through Hh and functions as an external terminal.

Figure 4A:
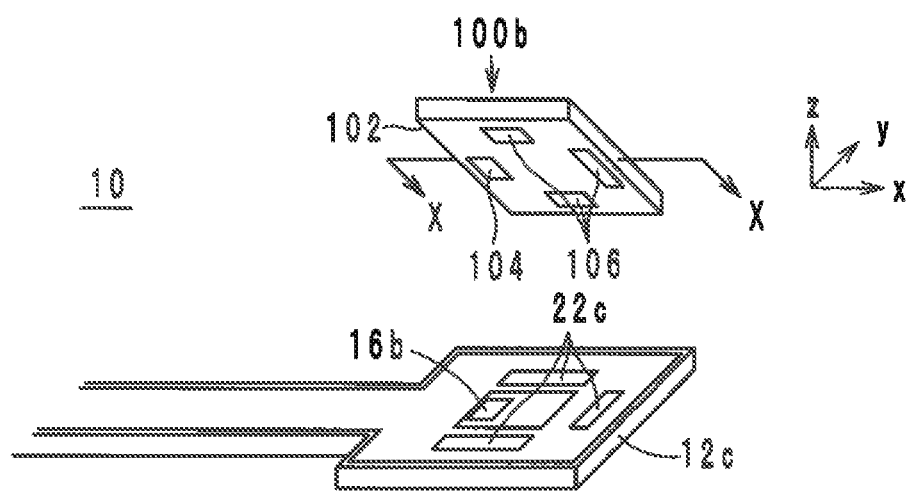
FIG. 4A is a perspective view of a connector of the high-frequency signal transmission line.
Figure 4B:
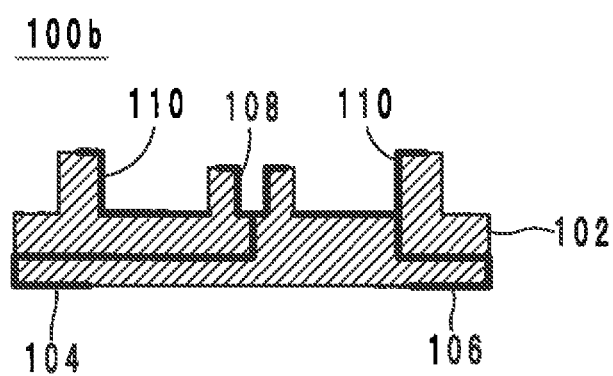
FIG. 4B is a sectional view of the connector of the high-frequency signal transmission line.

The connectors 100a and 100b are mounted on the front surfaces of the connecting portions 12b and 12c, respectively, and are electrically connected to the signal line 20 and the ground conductors 22 and 24. The connectors 100a and 100b preferably have the same structure, and the structure of the connector 100b is described below as an example. FIG. 4A is a perspective view of the connector 100b of the high-frequency signal transmission line 10. FIG. 4B is a sectional view of the connector 100b of the high-frequency signal transmission line 10.

The connector 100b, as illustrated in FIGS. 4A and 4B, includes a connector body 102, external terminals 104 and 106, a central conductor 108 and an external conductor 110. The connector body 102 is in the shape of a rectangular or substantially rectangular plate with a cylinder connected thereon, and is formed of an insulating material such as resin.

The external terminal 104 is provided on the surface of the plate-shaped portion of the connector body 102 at the negative side in the z-direction so as to face the external terminal 16b. The external terminal 106 is provided on the surface of the plate-shaped portion of the connector body 102 at the negative side in the z-direction so as to face the terminal portion 22c exposed through the openings Hf through Hh.

The central conductor 108 is located in the center of the cylindrical portion of the connector body 102 and is connected to the external terminal 104. The central conductor 108 is a signal terminal at which a high-frequency signal is input or output. The external conductor 110 is provided on the inner surface of the cylindrical portion of the connector body 102 and is connected to the external terminal 106. The external conductor 110 is aground terminal that is maintained at aground potential.

The connector 100b having the structure above is mounted on the front surface of the connecting portion 12c such that the external terminal 104 is connected to the external terminal 16b and such that the external terminal 106 is connected to the terminal portion 22c. Thus, the signal line 20 is electrically connected to the central conductor 108, and the ground conductors 22 and 24 are electrically connected to the external conductor 110.

Figure 5A:
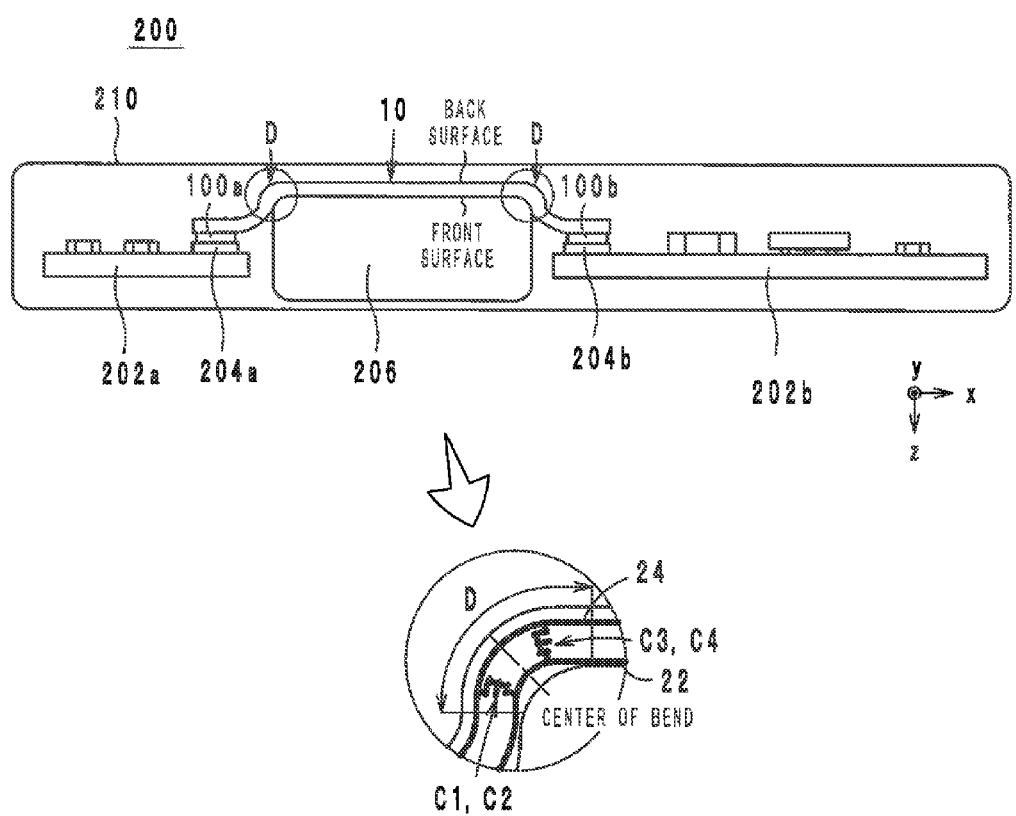
FIG. 5A is a plan view in a y-direction of an electronic device including the high-frequency signal transmission line.
Figure 5B:
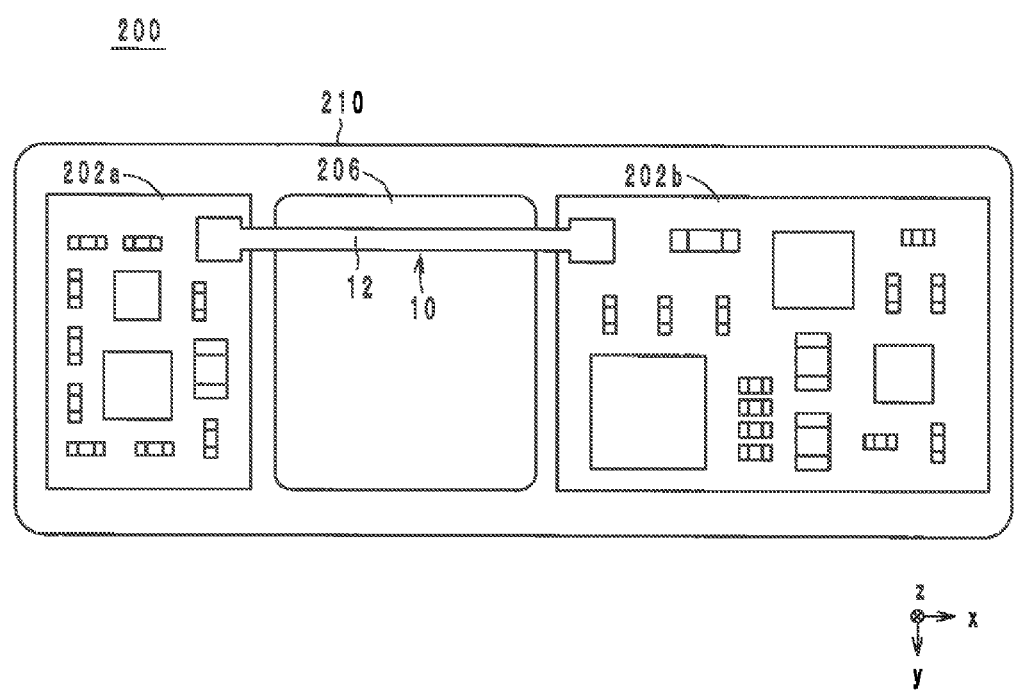
FIG. 5B is a plan view in a z-direction of the electronic device including the high-frequency signal transmission line.

The high-frequency signal transmission line 10 is preferably used in the following way. FIG. 5A is a plan view from the y-direction of an electronic device 200 including the high-frequency signal transmission line 10. FIG. 5B is a plan view from the z-direction of the electronic device 200 including the high-frequency signal transmission line 10.

The electronic device 200 includes the high-frequency signal transmission line 10, circuit boards 202a and 202b, receptacles 204a and 204b, a battery pack (an article) 206, and a case 210.

In the circuit board 202a, for example, a transmitting circuit or a receiving circuit including an antenna is provided. In the circuit board 202b, for example, a feed circuit is provided. The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The front surface of the dielectric body 12 (the main surface nearer the ground conductor 22 in relation to the signal line 20) is in contact with the battery 206, and the dielectric body 12 is fixed to the battery pack 206 by an adhesive. The back surface of the dielectric body 12 faces the inner surface of the case 210 with a predetermined space.

The receptacles 204a and 204b are provided on respective main surfaces of the circuit boards 202a and 202b at the negative side in the z-direction. The connectors 100a and 100b are connected to the receptacles 204a and 204b respectively. Thus, a high-frequency signal with a frequency of, for example, about 2 GHz transmitted between the circuit boards 202a and 202b is applied to the central conductors 108 of the connectors 100a and 100b through the receptacles 204a and 204b. The respective external conductors 110 of the connectors 100a and 100b are maintained at the ground potential through the circuit boards 202a and 202b, and the receptacles 204a and 204b. In this way, the high-frequency signal transmission line 10 connects the circuit boards 202a and 202b to each other.

There are level differences between the main surface of the battery pack 206 at the negative side in the z-direction and each of the receptacles 204a and 204b. Therefore, by bending near the both end of the line portion 12a of the dielectric body 12, it becomes possible to connect the connectors 100a and 100b to the receptacles 204a and 204b, respectively. In the electronic device 200 according to this preferred embodiment, the dielectric body 12 is bent at two positions, and as illustrated in FIG. 2, there are two bending sections D near the both ends of the dielectric body 12. As illustrated in FIG. 5A, the connection portions C1 through C4 are provided in each of the bending sections D.

Figure 5C:
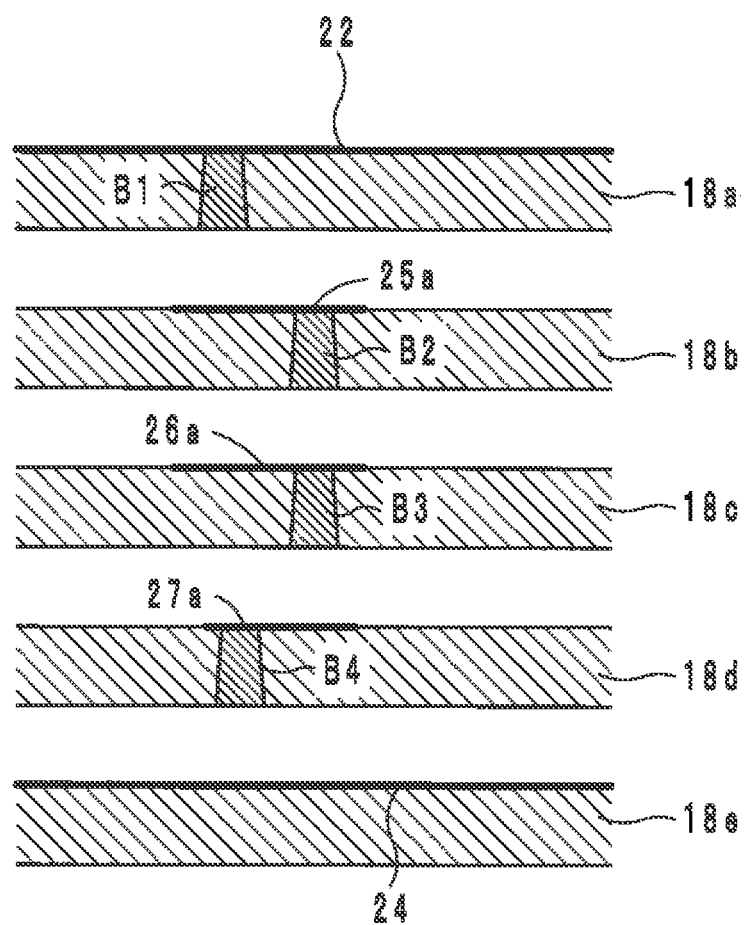
FIG. 5C is a sectional view of dielectric sheets before pressure bonding.

A non-limiting example of a manufacturing method of the high-frequency signal transmission line 10 is described below with reference to FIGS. 2 and 3A through 5C. FIG. 5C is a sectional view of the dielectric sheets 18a through 18e before pressure bonding. A manufacturing method of one high-frequency signal transmission line 10 is described below as an example. Practically, however, a plurality of high-frequency signal transmission lines 10 are manufactured at one time by stacking large-sized dielectric sheets on top of one another and cutting the stacked body.

First, dielectric sheets, each formed of thermoplastic resin and including a copper foil (metal film) formed entirely on the front surface, are prepared as the dielectric sheets 18a through 18e. Specifically, copper foils are applied to respective one main surface of the dielectric sheets 18a through 18c. The surfaces of the copper foils are, for example, galvanized for corrosion proof and thus are smoothened. The thicknesses of the copper foils are preferably within a range of about 10 μm to about 50 μm, for example.

Next, the ground conductor 22 and the external terminals 16a and 16b and as illustrated in FIG. 2 are formed on the front surface of the dielectric sheet 18a by a photolithography process. Specifically, resists having identical shapes to the external terminals 16a and 16b, and the ground conductor 22 are printed on the copper foil on the dielectric sheet 18a. Then, the copper foil is etched, so that the portions of the copper foil not covered by the resists are removed. Thereafter, the resists are removed. In this way, the ground conductor 22 and the external terminals 16a and 16b as illustrated in FIG. 2 are formed on the front surface of the dielectric sheet 18a.

Next, the connection conductors 25a, 25b, 45a and 45b as illustrated in FIG. 2 are formed on the front surface of the dielectric sheet 18b by a photolithography process. The connection conductors 26a, 26b, 46a and 46b as illustrated in FIG. 2 are formed on the front surface of the dielectric sheet 18c by a photolithography process. The signal line 20 and the connection conductors 27a, 27b, 47a and 47b as illustrated in FIG. 2 are formed on the front surface of the dielectric sheet 18d by a photolithography process. The ground conductor 24 as illustrated in FIG. 2 is formed on the front surface of the dielectric sheet 18e by a photolithography process. These photolithography processes are the same as the photolithography process for forming the main ground conductor 22 and the external terminals 16a and 16b, and descriptions of the processes are omitted here.

Next, the dielectric sheets 18a through 18d are exposed to laser beams from their respective back surfaces such that through holes are made in the dielectric sheets 18a through 18d at the positions of the via-hole conductors B1 through B8, B11 through B18 and b11 through b16. Thereafter, conductive paste is filled in the through holes.

Next, the dielectric sheets 18a through 18e are stacked in this order from the positive side to the negative side in the z-direction as illustrated in FIG. 5C. Next, heat and pressure are applied to the stacked body of the dielectric sheets 18a through 18e from the positive and negative sides in the z-direction. Thus, the dielectric sheets 18a through 18e are softened and bonded together, and the conductive paste filled in the through holes are hardened (metallized) to define the via-hole conductors B1 through B8, B11 through B18 and b11 through b16. In this moment, as illustrated in FIG. 3A, the connection conductors 25a, 27a, 25b, 27b, 45a, 47a, 45b, and 47b are pressed by the via-hole conductors B1 through B8 and B11 through B18 to become wavy. The dielectric sheets 18a through 18e are not necessarily joined by pressure bonding and may be joined alternatively by an adhesive such as an epoxy resin adhesive. It is not always necessary to form the via-hole conductors B1 through B8 and B11 through B18 by filling the through holes entirely with a conductor, and for example, it is possible to form the via-hole conductors B1 through B8 and B11 through B18 by forming a conductor only along the inner surface of each of the through holes.

Lastly, resin (resist) paste is applied to the front surface of the dielectric sheet 18a to form the protective layer 14.

In the high-frequency signal transmission line 10 having the structure above, the dielectric body 12 is easy to bend. Specifically, in the signal line disclosed in WO 2011/007660, a plurality of via-hole conductors are connected so as to be arranged straight in a stacking direction and define a cylinder. The via-hole conductors connected straight to define a cylinder are not flexible, and these via-hole conductors hinder bending of the stacked body.

In the high-frequency signal transmission line 10, on the other hand, the connection portions C1 through C4 have such a structure not to hinder bending of the dielectric body 12. Specifically, in the connection portion C1, the via-hole conductors B1 through B4 are connected not to be arranged straight in the z-direction. More specifically, the central axes of the via-hole conductors B1 and B4 are not at the same position in the x-direction as the central axes of the via-hole conductors B2 and B4. The negative end in the z-direction of the via-hole conductor B1 is connected to the positive end in the z-direction of the via-hole conductor B2 via the connection conductor 25a. The negative end in the z-direction of the via-hole conductor B3 is connected to the positive end in the z-direction of the via-hole conductor B4 via the connection conductor 27a. Unlike the via-hole conductors B1 through B4, the connection conductors 25a and 27a are thin conductor layers. Accordingly, the connection conductors 25a and 27a are flexible compared with the via-hole conductors B1 through B4. Therefore, when the dielectric body 12 is bent, the connection conductors 25a and 27a change their shapes. Thus, the connection portion C1 is configured to not hinder bending of the dielectric body 12. Consequently, the dielectric body 12 is easy to bend. The same applies to the connection portions C2 through C4.

In the high-frequency signal transmission line 10, the dielectric body 12 is easy to bend also for the reason below. Specifically, when the dielectric body 12 is bent, no compression stress and no tensile stress act on the neutral surface S0. Also, closer to the outer periphery from the neutral surface S0, a greater tensile stress acts, and closer to the inner periphery from the neutral surface S0, a greater compression stress acts. Also, in the section D where the dielectric body 12 is bent, closer to the center of bend from either end of the section D, a greater stress acts. Therefore, it is not good to locate inflexible via-hole conductors near the center of bend, near the front surface or the back surface of the dielectric body 12.

In view of the above, in the high-frequency signal transmission line 10, the via-hole conductors B1 and B4 that constitute the both ends in the z-direction of the connection portion C1 are located farther away from the center of bend than the other via-hole conductors B2 and B3 of the connection portion C1. Accordingly, the via-hole conductors B1 and B4 are located farther away from the center of bend than the via-hole conductor B2 crossing the neutral surface S0. With this arrangement, the via-hole conductors B1 and B4 are not located at positions where great stresses act, and it becomes less likely that the via-hole conductors B1 and B4 hinder bending of the dielectric body 12. For the reasons above, it is easy to bend the dielectric body 12 of the high-frequency signal transmission line 10. The same applies to the connection portions C2 through C4.

Figure 6:
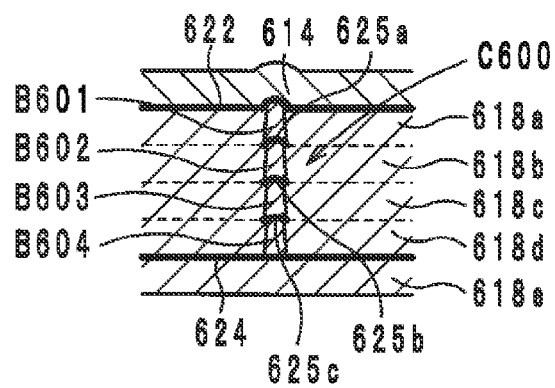
FIG. 6 is a sectional view of a connection portion of a high-frequency signal transmission line according to a comparative example.

In the high-frequency signal transmission line 10, also, it is unlikely that the portions where the connection portions C1 and C2 are provided protrude from the front surface or the back surface of the dielectric body 12. FIG. 6 is a sectional view of a connection portion C600 of a high-frequency signal transmission line 610 according to a comparative example.

In the high-frequency signal transmission line 610 illustrated in FIG. 6, in the connection portion C600, via-hole conductors B601 through B604 are connected to define a straight line. The via-hole conductors B601 through B604 are harder than dielectric sheets 618a through 618e, and at the time of thermocompression bonding of the dielectric sheets 618a through 618e, the via-hole conductors B601 through B604 protrude from the front surface and the back surface of the high-frequency signal transmission line 610.

In the high-frequency signal transmission line 10, on the other hand, in the connection portion C1, the central axes of the via-hole conductors B1 and B4 are not at the same position as the via-hole conductors B2 and B3. In other words, in the high-frequency signal transmission line 10, the via-hole conductors B1 through B4 are not arranged in a straight line. This arrangement reduces or prevents protrusion of the portions where the connection portion C1 is provided from the front surface or the back surface of the dielectric body 12. The same applies to the connection portions C2 through C4.

In the high-frequency signal transmission line 10, also, when the dielectric body 12 is bent, the connection conductors 25a through 27a, 25b through 27b, 45a through 47a and 45b through 47b deform, which prevents great forces from acting on the via-hole conductors B1 through B8 and B11 through B18. Accordingly, it is unlikely that the resilience of the deformed via-hole conductors B1 through B8 and B11 through B18 is transmitted to the dielectric sheets 18a through 18d and the ground conductors 22 and 24 around the via-hole conductors B1 through B8 and B11 through B18. Consequently, breakage around the via-hole conductors B1 through B8 and B11 through B18 is significantly reduced or prevented. Specifically, disconnections of the via-hole conductors B1 through B8 and B11 through B18 from the connection conductors 25a through 27a, 25b through 27b, 45a through 47a and 45b through 47b are reduced or prevented. Accordingly, the insertion loss of the high-frequency signal transmission line 10 is significantly reduced.

In the high-frequency signal transmission line 10, also, undesired radiation is reduced or prevented. Specifically, in the signal line disclosed in WO 2011/007660, at a side of the signal line, sets of via-hole conductors are provided such that each set of via-hole conductors are connected to define a straight line. Therefore, undesired radiation is likely to occur through the intervals between the sets of via-hole conductors.

In the high-frequency signal transmission line 10, on the other hand, the connection portions C1 through C4 are zigzag shaped when viewed from the y-direction. Accordingly, the width (size in the x-direction) of each of the connection portions C1 through C4 is greater than the width (size in the x-direction) of each set of via-hole conductors in the signal line disclosed in WO 2011/007660. Therefore, noise radiated from the signal line 20 is likely to be absorbed by the connection portions C1 through C4. Thus, in the high-frequency signal transmission line 10, undesired radiation from the negative and positive sides in the y-direction is reduced or prevented.

In the high-frequency signal transmission line 10, the connection portions C1 through C4 are connected to the ground conductor 24 by contacting with the bridges 60 between the openings 30. Thus, the potentials of the bridges 60 come close to the ground potential, and occurrences of undesired inductor components at the bridges 60 are significantly reduced or prevented.

In the high-frequency signal transmission line 10, the characteristic impedance of the signal line 20 in the areas A1 is greater than the characteristic impedance of the signal line 20 in the areas A3 and A4. The characteristic impedance of the signal line 20 in the areas A3 and A4 are greater than the characteristic impedance of the signal line 20 in the areas A2. More specifically, between two adjacent bridges 60, with increasing distance from one of the bridges 60 and with decreasing distance from the other of the bridges 60, the impedance of the signal line 20 increases from a minimum value Z2 to an intermediate value Z3 and further to a maximum value Z1 and thereafter decreases from the maximum value Z1 to the intermediate value Z3 and further to the minimum value Z2.

The width (size in the y-direction) W1 of the opening portions 30b is greater than the width (size in the y-direction) W2 of the opening portions 30a and 30c. Accordingly, the distance between the signal line 20 and the ground conductor 24 in the areas A1 is greater than the distance between the signal line 20 and the ground conductor 24 in the areas A3 and A4. Therefore, the magnetic field strength acting on the signal line 20 in the areas A1 is greater than the magnetic field strength acting on the signal line 20 in the areas A3 and A4. Thus, the inductance components of the signal line 20 in the areas A1 are great. In other words, in the areas A1, the inductance of the signal line 20 is dominant.

On the other hand, the distance between the signal line 20 and the ground conductor 24 in the areas A2 is smaller than the distance between the signal line 20 and the ground conductor 24 in the areas A3 and A4. Therefore, the capacitance occurring on the signal line 20 in the areas A2 is greater than the capacitance occurring on the signal line 20 in the areas A3 and A4. Also, the magnetic field strength in the areas A2 is smaller than the magnetic field strength in the areas A3 and A4. Thus, in the areas A2, the capacitance on the signal line 20 is dominant.

As described above, in the areas A1, since almost no capacitance is generated between the signal line 20 and the ground conductor 24, the maximum impedance value Z1 results mainly from the inductance of the signal line 20. In the areas A2, since great capacitance is generated between the signal line 20 and the ground conductor 24, the minimum impedance value Z2 results mainly from the capacitance. In the areas A3 and A4, the intermediate impedance value Z3 results from the inductance and the capacitance. Accordingly, the characteristic impedance of the signal line 20 changes cyclically so as to decrease from the maximum value Z1 to the intermediate value Z3 and to the minimum value Z2 and thereafter increase from the minimum value Z2 to the intermediate value Z3 and to the maximum value Z1. The maximum impedance value Z1 preferably is, for example, about 70Ω. The minimum impedance value Z2 preferably is, for example, about 30Ω. The intermediate impedance value Z3 preferably is, for example, about 50Ω. The maximum value Z1, the minimum value Z2 and the intermediate value Z3 are designed such that the characteristic impedance of the signal line 20 as a whole becomes a predetermined value (for example, about 50Ω).

The high-frequency signal transmission line 10, further, achieves a reduction in the transmission loss by stabilization of the ground potential and an improvement in the shield characteristic. Specifically, in the high-frequency signal transmission line 10, the width (size in the y-direction) W1 of the opening portions 30b is greater than the width (size in the y-direction) W2 of the opening portions 30a and 30c. Accordingly, in the high-frequency signal transmission line 10, the magnetic energy of the signal line 20 in the areas A1 is higher than the magnetic energy of the signal line in the areas A3 and A4, and the magnetic energy of the signal line 20 in the areas A2 is lower than the magnetic energy of the signal line in the areas A3 and A4. Therefore, the characteristic impedance of the signal line 20 changes cyclically from Z2, Z3, Z1, Z3, Z2 . . . in this order. Thus, the change of the magnetic energy along the signal line 20 from an area to its adjacent area in the x-direction is mild. Hence, at the borders between the openings 30 and the bridges 60, the magnetic energy is small, and changes in the ground potential of the ground conductor 24 are reduced. Consequently, undesired radiation and transmission loss of a high-frequency signal are significantly reduced or prevented.

First Modification

Figure 7:
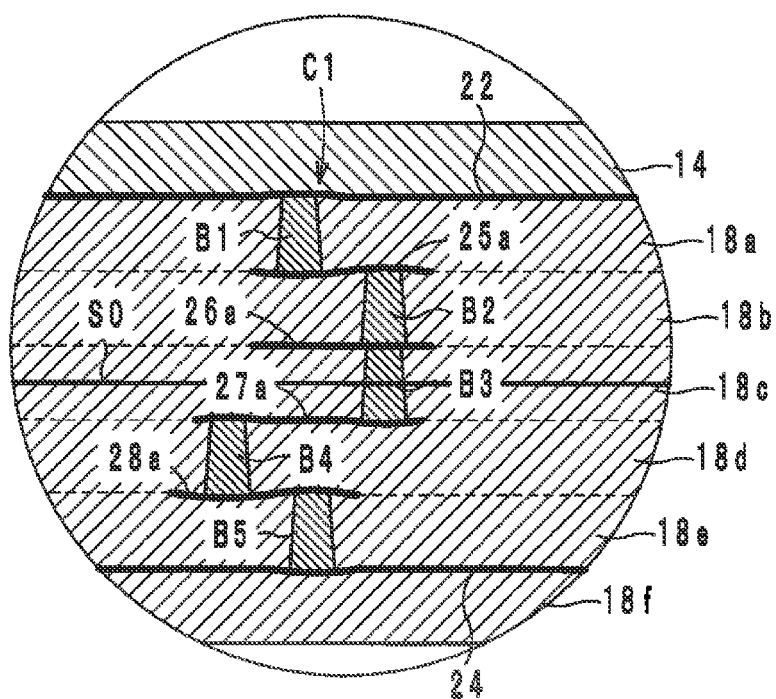
FIG. 7 is a sectional view of a connection portion of a high-frequency signal transmission line.

A high-frequency signal transmission line 10a according to a first modification of a preferred embodiment of the present invention is described below with reference to the drawings. FIG. 7 is a sectional view of a connection portion C1 of the high-frequency signal transmission line 10a.

The high-frequency signal transmission line 10a is different from the high-frequency signal transmission line 10 in the structure of the connection portion C1. Specifically, in the high-frequency signal transmission line 10a, the connection portion C1 includes via-hole conductors B1 through B5 connected to one another. The via-hole conductors B1 and B5 that constitute respectively the both ends in the z-direction of the connection portion C1 are located farther away from the center of bend than the via-hole conductor B3 crossing the neutral surface S0. However, the via-hole conductors B1 and B5 are located nearer to the center of bend than the via-hole conductor B4. In the high-frequency signal transmission line 10a, the via-hole conductors B1 and B5 are not located at positions where great stresses act, and it becomes less likely that the via-hole conductors B1 and B5 hinder bending of the dielectric body 12. Thus, in the high-frequency signal transmission line 10a, the dielectric body 12 is easy to bend.

Second Modification

Figure 8A:
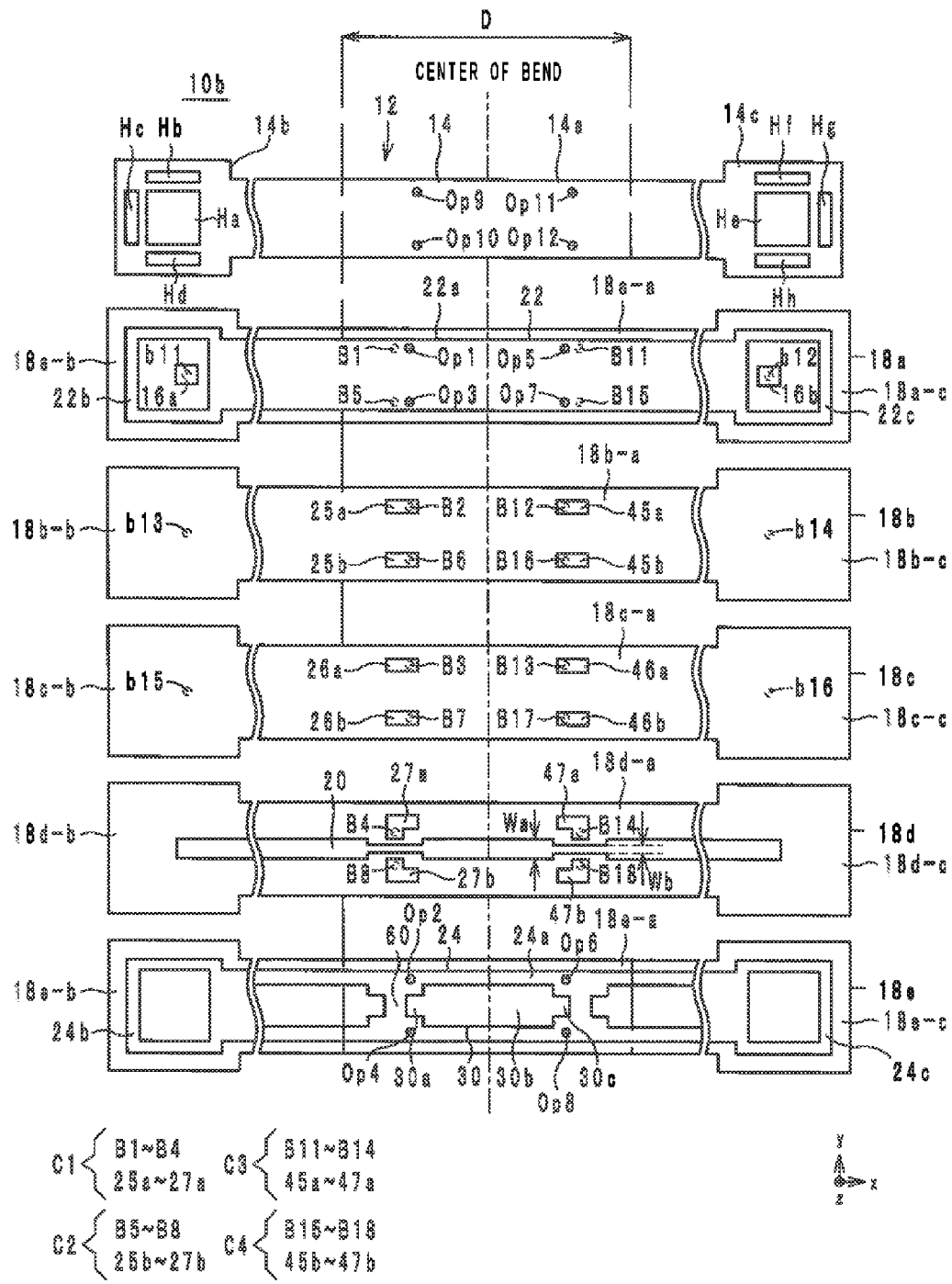
FIG. 8A is an exploded view of a dielectric body of a high-frequency signal transmission line.
Figure 8B:
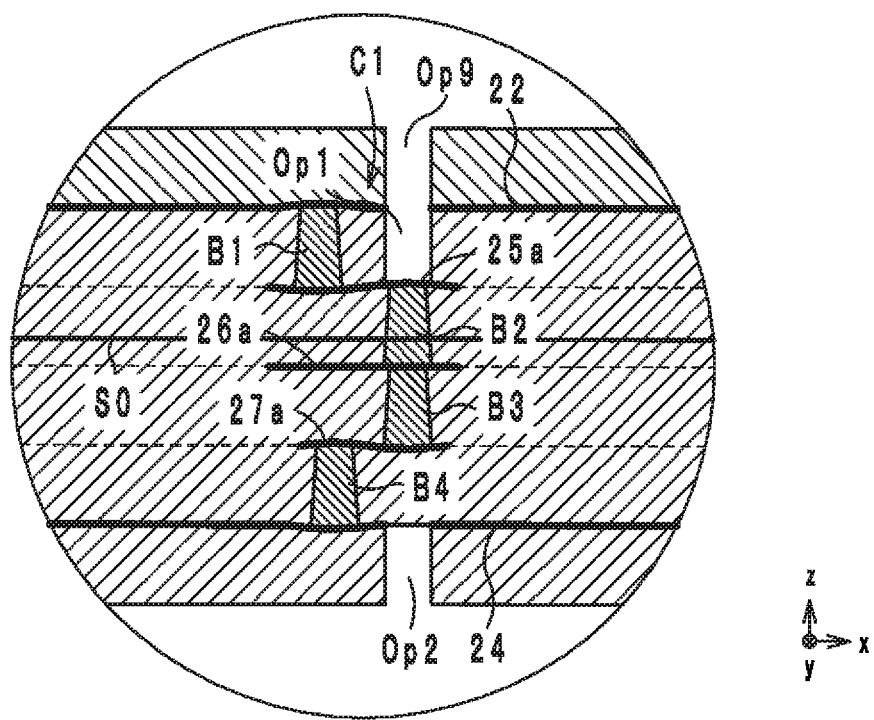
FIG. 8B is a sectional view of a connection portion of the high-frequency signal transmission line.
Figure 8C:
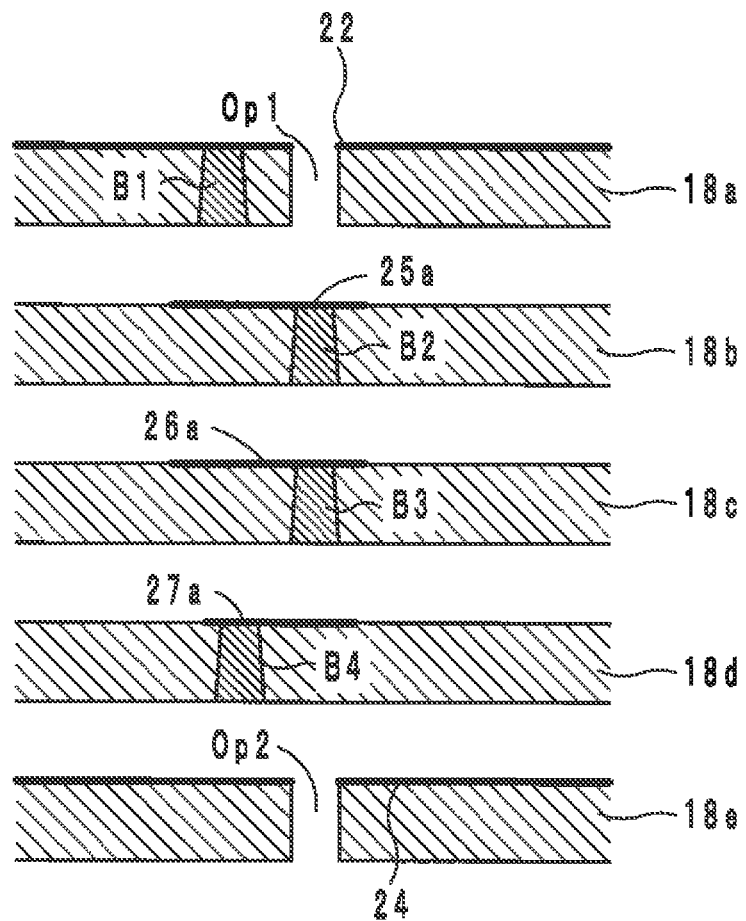
FIG. 8C is a sectional view of dielectric sheets before pressure bonding.

A high-frequency signal transmission line 10b according to a second modification of a preferred embodiment of the present invention is described below with reference to the drawings. FIG. 8A is an exploded view of a dielectric body 12 of the high-frequency signal transmission line 10b. FIG. 8B is a sectional view of a connection portion C1 of the high-frequency signal transmission line 10b. FIG. 8C is a sectional view of dielectric sheets 18a through 18e before pressure bonding.

The high-frequency signal transmission line 10b is different from the high-frequency signal transmission line 10 in that the dielectric sheet 18a has openings Op1, Op3, Op5 and Op7 and in that the dielectric sheet 18e has openings Op2, Op4, Op6 and Op8.

Specifically, as seen in FIGS. 8A and 8B, the opening Op1 is located in the dielectric sheet 18a farther in the positive z-direction than the via-hole conductor B2, at a position to overlap with the via-hole conductor B2 when viewed from the z-direction, and the opening Op2 is located in the dielectric sheet 18e farther in the negative z-direction than the via-hole conductor B3, at a position to overlap with the via-hole conductor B3 when viewed from the z-direction. Similarly, the opening Op3 is located in the dielectric sheet 18a farther in the positive z-direction than the via-hole conductor B2, at a position to overlap with the via-hole conductor B6 when viewed from the z-direction, and the opening Op4 is located in the dielectric sheet 18e farther in the negative z-direction than the via-hole conductor B3, at a position to overlap with the via-hole conductor B7 when viewed from the z-direction.

Also, as seen in FIG. 8A, the opening Op5 is located in the dielectric sheet 18a farther in the positive z-direction than the via-hole conductor B12, at a position to overlap with the via-hole conductor B12 when viewed from the z-direction, and the opening Op6 is located in the dielectric sheet 18e farther in the negative z-direction than the via-hole conductor B13, at a position to overlap with the via-hole conductor B13 when viewed from the z-direction. Similarly, the opening Op7 is located in the dielectric sheet 18a farther in the positive z-direction than the via-hole conductor B12, at a position to overlap with the via-hole conductor B16 when viewed from the z-direction, and the opening Op8 is located in the dielectric sheet 18e farther in the negative z-direction than the via-hole conductor B13, at a position to overlap with the via-hole conductor B17 when viewed from the z-direction.

In the high-frequency signal transmission line 10b, as illustrated in FIG. 8C, after making the openings Op1 through Op8, the dielectric sheets 18a through 18e are stacked and pressure-bonded together. Further, in forming the protective layer 14, openings Op9 through Op12 are made in the protective layer 14 such that the openings Op1, Op3, Op5 and Op7 are not covered by the protective layer 14.

In the high-frequency signal transmission line 10b having the structure above, the openings Op1 through Op8 are provided, and thus, the dielectric sheets are removed from the portions around the connection portion C1 where great stresses act. This makes it easier to bend the dielectric body 12. The openings Op1 through Op8 may be made in only one of the dielectric sheets 18a and 18e. Further, the ground conductors 22 and 24 may include openings (non-conductive portions) at positions that overlap with the openings Op1 through Op8.

Third Modification

Figure 9:
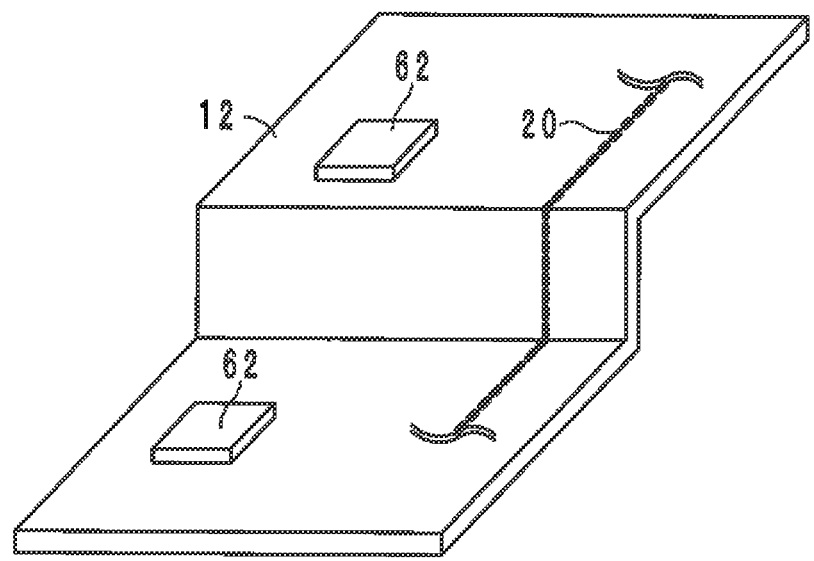
FIG. 9 is a perspective view of a circuit board according to a modification of a preferred embodiment of the present invention.

A circuit board 10c according to a third modification of a preferred embodiment of the present invention is described below with reference to the drawings. FIG. 9 is a perspective view of the circuit board 10c.

The circuit board 10c is, for example, a thin flexible circuit board provided in an electronic device as a subsidiary circuit board separate from a main circuit board. The circuit board 10c includes a high-frequency signal transmission line having the same structure as the dielectric body 12 of the high-frequency signal transmission line 10 in a stacked body of dielectric layers. (In FIG. 9, only the signal line 20 is indicated, and the ground conductors 22 and 24, and the connection portions C1 through C4 are not indicated.) On the circuit board 10, components 62 are mounted as needed. While the high-frequency signal transmission line 10 is strip-shaped, the circuit board 10c is rectangular or substantially rectangular. The circuit board 10c including the high-frequency signal transmission line that is bent when used may include the connection portions C1 through C4.

Other Preferred Embodiments

High-frequency signal transmission lines according to the present invention are not limited to the high-frequency signal transmission lines 10, 10a and 10b, and the circuit board 10c according to the preferred embodiments above, and various changes are possible within the scope of the present invention.

In the high-frequency signal transmission line 10, the via-hole conductor B1 may cross the neutral surface S0. In this case also, in the connection portion C1, the via-hole conductors B1 and B4 preferably are located farther away from the center of bend than the via-hole conductors B2 and B3. With this arrangement, the via-hole conductors B1 and B4 are not located at positions where great stresses act, and it becomes less likely that the via-hole conductors B1 and B4 hinder bending of the dielectric body 12.

The connection portions C1 through C4 may be located outside the section D.

If there are two or more bending sections D in the dielectric body 12, the via-hole conductors located at the both ends in the z-direction of a connection portion shall be located farther away from the center of bend of the nearest section D from the connection portion than the other via-hole conductors of the connection portion. Also, the via-hole conductors located at the both ends in the z-direction of the connection portion shall be located farther away from the center of bend of the nearest section D from the connection portion than the via-hole conductor of the connection portion crossing the neutral surface S0.

In the high-frequency signal transmission line 10, the central axis of the via-hole conductor B1 and the central axis of the via-hole conductor B4 are at slightly different positions in the x-direction, but the central axes of the via-hole conductors B1 and B4 may be at the same position in the x-direction. Similarly, the central axis of the via-hole conductor B1 and the central axis of the via-hole conductor B4 are at slightly different positions in the y-direction, but the central axes of the via-hole conductors B1 and B4 may be at the same position in the y-direction.

In the high-frequency signal transmission line 10, the ground conductor 24 (second ground conductor) includes openings 30. However, the openings 30 do not always need to be provided, and the ground conductor 24 may be formed as a continuous conductor.

In contrast, the ground conductor 22 as well as the ground conductor 24 may include openings.

In the high-frequency signal transmission line 10, the via-hole conductors B1 and B4 are located at different positions from the via-hole conductors B2 and B3 so as not to overlap with the via-hole conductors B2 and B3 at all when viewed from the z-direction. However, the via-hole conductors B1 and B4 may overlap with the via-hole conductors B2 and B3 when viewed from the z-direction. In order to facilitate bending of the dielectric body 12 and to diminish or eliminate the risk of breakage around the via-hole conductors, however, it is more desired that the via-hole conductors B1 and B4 do not overlap with the via-hole conductors B2 and B3 at all when viewed from the z-direction.

As thus far described, preferred embodiments of the present invention are useful in a high-frequency signal transmission line and an electronic device, and preferred embodiments of the present invention provide the advantage of facilitating bending.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line that is bent when used, the high-frequency signal transmission line comprising:
   a body including dielectric layers stacked on top of one another;
   a signal line provided in the body;
   a first ground conductor located at one side in a stacking direction in relation to the signal line so as to face the signal line across one or more of the dielectric layers;
   a second ground conductor located at another side in the stacking direction in relation to the signal line so as to face the signal line across one or more of the dielectric layers; and
   a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor; wherein
   two of the interlayer connection conductors that constitute both ends in the stacking direction of the connection portion are located farther away from a center of a bending section where the body is to be bent than the other interlayer connection conductors of the connection portion; and
   openings are located respectively in ones of the dielectric layers located at the one side and the another side in the stacking direction in relation to the other interlayer connection conductors, at positions that overlap with the other interlayer connection conductors.

2. The high-frequency signal transmission line according to claim 1, wherein the connection portion is located within the bending section where the body is to be bent.

3. The high-frequency signal transmission line according to claim 1, wherein
   the second ground conductor includes a plurality of openings arranged along the signal line; and
   the connection portion is connected to the second ground conductor by contacting with a portion between adjacent ones of the openings.

4. A high-frequency signal transmission line that is bent when used, the high-frequency signal transmission line comprising:
   a body including dielectric layers stacked on top of one another;
   a signal line provided in the body;
   a first ground conductor located at a side in a stacking direction in relation to the signal line so as to face the signal line across one or more of the dielectric layers;
   a second ground conductor located at another side in the stacking direction in relation to the signal line so as to face the signal line across one or more of the dielectric layers; and
   a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor; wherein
   two of the interlayer connection conductors that constitute both ends in the stacking direction of the connection portion are located farther away from a center of a bending section where the body is to be bent than another of the interlayer connection conductors of the connection portion crossing a neutral surface of the bending section.

5. The high-frequency signal transmission line according to claim 4, wherein openings are located respectively in ones of the dielectric layers located at the one side and the another side in the stacking direction in relation to the another of the interlayer connection conductors crossing the neutral surface, at positions that overlap with the another of the interlayer connection conductors crossing the neutral surface.

6. The high-frequency signal transmission line according to claim 4, wherein the connection portion is located within the bending section where the body is to be bent.

7. The high-frequency signal transmission line according to claim 4, wherein
the second ground conductor includes a plurality of openings arranged along the signal line; and
the connection portion is connected to the second ground conductor by contacting with an area between adjacent ones of the openings.

8. An electronic device comprising:
an article; and
a high-frequency signal transmission line that is bent when used; wherein
the high-frequency signal transmission line includes:
a body including dielectric layers stacked on top of one another;
a signal line provided in the body;
a first ground conductor located at one side in a stacking direction in relation to the signal line so as to face the signal line across one or more of the dielectric layers;
a second ground conductor located at another side in the stacking direction in relation to the signal line so as to face the signal line across one or more of the dielectric layers; and
a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor; wherein
two of the interlayer connection conductors that constitute both ends in the stacking direction of the connection portion are located farther away from a center of a bending section where the body is to be bent than another of the interlayer connection conductors of the connection portion crossing a neutral surface of the bending section; and
a main surface of the body nearer to the first ground conductor in relation to the signal line contacts the article.

9. The electronic device according to claim 8, wherein the second ground conductor includes a plurality of openings arranged along the signal line.

10. The electronic device according to claim 9, further comprising a case housing the article and the high-frequency signal transmission line; wherein
a main surface of the body nearer to the second ground conductor in relation to the signal line faces an inner surface of the case with a predetermined space.

11. The electronic device according to claim 8, wherein openings are located respectively in ones of the dielectric layers located at the one side and the another side in the stacking direction in relation to the another of the interlayer connection conductors crossing the neutral surface, at positions that overlap with the another of the interlayer connection conductors crossing the neutral surface.

12. The electronic device according to claim 8, wherein the connection portion is located within the bending section where the body is to be bent.

13. The electronic device according to claim 8, wherein
the second ground conductor includes a plurality of openings arranged along the signal line; and
the connection portion is connected to the second ground conductor by contacting with an area between adjacent ones of the openings.

14. An electronic device comprising:
an article; and
a high-frequency signal transmission line that is bent when used; wherein
the high-frequency signal transmission line includes:
a body including dielectric layers stacked on top of one another;
a signal line provided in the body;
a first ground conductor located at one side in a stacking direction in relation to the signal line so as to face the signal line across one or more of the dielectric layers;
a second ground conductor located at another side in the stacking direction in relation to the signal line so as to face the signal line across one or more of the dielectric layers; and
a connection portion including a plurality of interlayer connection conductors, each of the interlayer connection conductors pierced in one of the dielectric layers, and a plurality of connection conductors, each of the connection conductors provided on one of the dielectric layers, the connection portion configured to connect the first ground conductor to the second ground conductor; wherein
two of the interlayer connection conductors that constitute both ends in the stacking direction of the connection portion are located farther away from a center of a bending section where the body is to be bent than another of the interlayer connection conductors of the connection portion crossing a neutral surface of the bending section;
openings are located respectively in ones of the dielectric layers located at the one side and the another side in the stacking direction in relation to the other interlayer connection conductors, at positions that overlap with the other interlayer connection conductors; and
a main surface of the body nearer to the first ground conductor in relation to the signal line contacts the article.

15. The electronic device according to claim 14, wherein the second ground conductor includes a plurality of openings arranged along the signal line.

16. The electronic device according to claim 15, further comprising a case housing the article and the high-frequency signal transmission line; wherein
a main surface of the body nearer to the second ground conductor in relation to the signal line faces an inner surface of the case with a predetermined space.

17. The electronic device according to claim 14, wherein the connection portion is located within the bending section where the body is to be bent.

18. The electronic device according to claim 14, wherein
the second ground conductor includes a plurality of openings arranged along the signal line; and
the connection portion is connected to the second ground conductor by contacting with a portion between adjacent ones of the openings.

* * * * *